United States Patent
Jang et al.

(10) Patent No.: US 12,074,704 B2
(45) Date of Patent: Aug. 27, 2024

(54) DATA DECODING METHOD AND DEVICE IN COMMUNICATION AND BROADCAST SYSTEM

(71) Applicant: SAMSUNG ELECTRONICS CO., LTD., Suwon-si (KR)

(72) Inventors: Min Jang, Suwon-si (KR); Changyeon Kim, Suwon-si (KR); Kyeongyeon Kim, Suwon-si (KR); Yeongsam Kim, Suwon-si (KR); Youngkwan Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/080,202

(22) Filed: Dec. 13, 2022

(65) Prior Publication Data

US 2023/0171025 A1 Jun. 1, 2023

Related U.S. Application Data

(63) Continuation of application No. PCT/KR2022/019309, filed on Nov. 30, 2022.

(30) Foreign Application Priority Data

Nov. 30, 2021 (KR) .................. 10-2021-0169124

(51) Int. Cl.
    *H04L 1/00* (2006.01)
(52) U.S. Cl.
    CPC .......... *H04L 1/0047* (2013.01); *H04L 1/0046* (2013.01); *H04L 1/0061* (2013.01)
(58) Field of Classification Search
    CPC ... H04L 1/0047; H04L 1/0046; H04L 1/0061; H04L 1/005; H04L 1/0065; H03M 13/2966; H03M 13/3746; H03M 13/451
    (Continued)

(56) References Cited

U.S. PATENT DOCUMENTS

| | | |
|---|---|---|
| 8,495,447 B2 | 7/2013 | Papageorgiou |
| 10,567,008 B2 | 2/2020 | Hussain et al. |

(Continued)

FOREIGN PATENT DOCUMENTS

| | | |
|---|---|---|
| CN | 103916141 | 7/2014 |
| EP | 4 050 805 | 8/2022 |

(Continued)

OTHER PUBLICATIONS

Search Report and Written Opinion dated Feb. 24, 2023 issued in International Patent Application No. PCT/KR2022/019309.

(Continued)

*Primary Examiner* — Albert Decady
*Assistant Examiner* — Osman M Alshack
(74) *Attorney, Agent, or Firm* — Nixon & Vanderhye, P.C.

(57) ABSTRACT

The present disclosure relates to a communication method and system for converging a $5^{th}$-Generation (5G) communication system for supporting higher data rates beyond a $4^{th}$-Generation (4G) system with a technology for Internet of Things (IoT). The present disclosure may be applied to intelligent services based on the 5G communication technology and the IoT-related technology, such as smart home, smart building, smart city, smart car, connected car, health care, digital education, smart retail, security and safety services. Further, the present disclosure relates to decoding of a turbo code in a communication system including long term evolution (LTE), and to efficiently implement a method, procedure, and device for receiving and decoding a signal transmitted in a mobile communication system.

19 Claims, 9 Drawing Sheets

(58) Field of Classification Search
USPC .................................. 714/755, 758, 776
See application file for complete search history.

(56) References Cited

U.S. PATENT DOCUMENTS

| | | | |
|---|---|---|---|
| 11,146,355 B2* | 10/2021 | Myung | H03M 13/2906 |
| 11,239,945 B2* | 2/2022 | Maevskii | H04L 1/1845 |
| 2003/0067868 A1 | 4/2003 | Becker et al. | |
| 2008/0225965 A1 | 9/2008 | Pi et al. | |
| 2009/0106637 A1* | 4/2009 | Kim | H04L 1/0065 |
| | | | 714/E11.032 |
| 2010/0091899 A1* | 4/2010 | Shimizu | H04L 1/0071 |
| | | | 375/262 |
| 2013/0201886 A1* | 8/2013 | Spencer | H03M 13/2957 |
| | | | 370/310 |
| 2015/0006992 A1* | 1/2015 | Xiong | G06F 11/1004 |
| | | | 714/755 |
| 2016/0277096 A1* | 9/2016 | Wu | H03M 13/258 |
| 2019/0020445 A1* | 1/2019 | Kim | H04L 1/0057 |
| 2019/0173498 A1 | 6/2019 | El-Khamy et al. | |
| 2019/0312676 A1* | 10/2019 | Jeong | H03M 13/15 |
| 2020/0106566 A1* | 4/2020 | Yeo | H04W 28/04 |
| 2020/0366317 A1* | 11/2020 | Myung | H03M 13/1125 |
| 2022/0038118 A1* | 2/2022 | Sun | H03M 13/2975 |
| 2022/0294471 A1* | 9/2022 | Gunturu | H03M 13/09 |

FOREIGN PATENT DOCUMENTS

| | | |
|---|---|---|
| KR | 10-0499469 | 7/2005 |
| KR | 10-2009-0125080 | 12/2009 |
| KR | 10-2015-0096340 | 8/2015 |
| KR | 10-2021-0057787 | 5/2021 |
| KR | 10-2021-0067967 | 6/2021 |

OTHER PUBLICATIONS

T. Tonnellier et al., "Lowering the Error Floor of Turbo Codes with CRC Verification", IEEE Wireless Communications Letters, vol. 5, No. 4, Aug. 2016, 4 pages.

TS36.212 V16.4.0, 3GPP, $3^{rd}$ Generation Partnership Project, Technical Specification Group Radio Access Network; Evolved Universal Terrestrial Radio Access (E-UTRA); Multiplexing and channel coding (Release 16), Dec. 2020, 269 pages.

* cited by examiner

FIG. 5

DATA DECODING METHOD AND DEVICE IN COMMUNICATION AND BROADCAST SYSTEM

CROSS-REFERENCE TO RELATED APPLICATIONS

This application is a continuation of International Application No. PCT/KR2022/019309 designating the United States, filed on Nov. 30, 2022, in the Korean Intellectual Property Receiving Office, and claiming priority to Korean Patent Application No. 10-2021-0169124, filed on Nov. 30, 2021, in the Korean Intellectual Property Office, the disclosures of which are incorporated by reference herein in their entireties.

BACKGROUND

Field

The disclosure relates to error-correcting codes for correcting and restoring data when errors or losses occur or are likely to occur due to various causes such as a noise and an interference in the process of data transmission or storage. For example, the disclosure relates to decoding of a turbo code in an LTE system, and relates to efficiently implementing methods, procedures, and devices for receiving and decoding a signal transmitted in a mobile communication system.

Description of Related Art

To meet the demand for wireless data traffic having increased since deployment of $4^{th}$ generation (4G) communication systems, efforts have been made to develop an improved $5^{th}$ generation (5G) or pre-5G communication system. Therefore, the 5G or pre-5G communication system is also called a 'Beyond 4G Network' or a 'Post LTE System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

In general, when data is transmitted and received between a transmitter and a receiver in a communication and broadcasting system, a data error may occur due to noise existing in a communication channel. As a coding scheme designed to correct errors generated by a communication channel in the receiver, there are error detection codes and error correcting codes (ECC) schemes. In particular, error correcting codes used in communication between transceivers is generally referred to as channel coding or forward error correction (FEC). The transmitter encodes the data bit sequence to be transmitted, generates, and transmits a codeword bit sequence, and the receiver decodes the codeword bit sequence mixed with error or noise to overcome the error/noise and estimate the date bit sequence.

Various channel coding techniques are used in communication and broadcasting systems. The channel coding techniques used today include convolutional code, turbo code, low-density parity-check coding (LDPC code), polar code, and the like. Among the channel coding techniques, the turbo code is a channel coding technique that achieves performance close to the channel capacity, which is the performance limit for the first time. Based on superior performance, the turbo code is used in various communication systems, and is typically used in 3GPP 4th generation (4G) long-term evolution (LTE) among mobile communication systems. The present disclosure relates to effectively decoding a signal encoded with the turbo code.

SUMMARY

Embodiments of the disclosure provide devices and methods for effectively decoding a turbo code in a communication system. The communication system may include, for example, a 4G LTE communication system. Channel coding used in mobile communication systems including turbo codes is designed to flexibly support various coding rates and lengths. Since it is necessary to obtain a turbo code with a high code rate in a situation where a high data rate must be achieved, a method of puncturing (a method of reducing the code length by not including some of the generated codeword bits in the transmission bit sequence) some of the codeword bits generated through a mother code is used. When a plurality of codeword bits are punctured to achieve a high code rate in the LTE turbo coding system, a problem arises in which the error-correcting performance is seriously degraded in some code dimension (length of encoded input bit sequence) and code length (length of encoded output bit sequence). According to various embodiments of the disclosure, a serious degradation of the error-correction performance is improved with low complexity and simple operation.

According to an example embodiment of the disclosure, a method performed by a receiving device of a communication system may comprise: determining whether decoding on an estimated bit sequence has failed; determining, based on the decoding being determined to be unsuccessful, whether to perform a post-processing depending on whether a code parameter satisfies a specified condition; identifying, based on the post-processing determined to be performed, one bit index corresponding to the specified condition; and performing decoding of an external concatenated code based on a modified bit sequence in which the bit corresponding to the identified one bit index in the estimated bit sequence is inverted.

According to an example embodiment, the code parameter may include at least one of a code dimension, a code length, and a code rate.

According to an example embodiment, the modified bit sequence may be converted to 0 based on a bit corresponding to the identified one bit index in the estimated bit sequence being 1, and converted to 1 based on a bit corresponding to the identified one bit index in the estimated bit sequence being 0.

According to an example embodiment, the specified condition may be any one of values in which the code dimension is specified.

According to an example embodiment, the specified condition may be that a code dimension is any one of preset values and a code rate is equal to or greater than a specified threshold value.

According to an example embodiment, the one bit index may be determined by the code dimension.

According to an example embodiment, the one bit index may be 40, based on the code dimension being 48; the one bit index may be 57, based on the code dimension being 72; the one bit index may be 72, based on the code dimension being 80; the one bit index may be 66, based on the code dimension being 88; the one bit index may be 105, based on the code dimension being 120; the one bit index may be 152, based on the code dimension being 160; and the one bit index may be 200, based on the code dimension being 208.

According to an example embodiment, a receiving device of a communication system may comprise: a transceiver and at least one processor; wherein the at least one processor is configured to: determine whether decoding on an estimated bit sequence has failed; determine, based on the decoding being determined to be unsuccessful, whether to perform a post-processing depending on whether a code parameter satisfies a specified condition; identify, based on the post-processing performance being determined, one bit index corresponding to the specified condition; and perform decoding of an external concatenated code based on a modified bit sequence in which the bit corresponding to the identified one bit index in the estimated bit sequence is inverted.

The method and device according to various example embodiments of the present disclosure are made to prevent and/or reduce serious performance degradation that may occur in a specific code parameter and to achieve stable performance in receiving and decoding a signal encoded by an LTE turbo code.

The method and device according to various example embodiments of the present disclosure operates in a specified manner on a system, so it is simple and low in complexity, and it operates stably because it does not produce unexpected behavior and results in system operation.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIG. 5 is a diagram illustrating a part of a generation matrix configured when a code dimension is 160 and a code length is 204 in a 3GPP ($3^{rd}$ generation partnership project) LTE(long term evolution) turbo code system according to embodiments;

DETAILED DESCRIPTION

Figure 1:
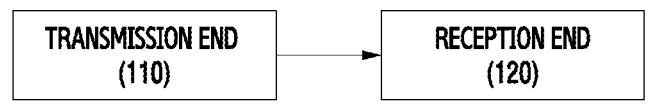
FIG. 1 is a block diagram illustrating an example configuration of a wireless communication system according to embodiments.

Hereinafter, various example embodiments of the present disclosure will be described in greater detail with reference to the accompanying drawings.

In describing the various embodiments, a description of the technical contents that are well known in the art to which this disclosure belongs or are not directly related to the disclosure may be omitted. This is to convey the gist of the present disclosure more clearly without obscuring the gist of the present disclosure by omitting unnecessary description.

Advantages and features of the present disclosure, and a method for achieving them, will be more apparent with reference to the embodiments described below in detail together with the accompanying drawings. However, the disclosure is not limited to the embodiments described below, and may be implemented in various different forms, the various embodiments are provided to inform those of ordinary skill in the art to which the present disclosure pertains. Throughout the disclosure, the same reference numerals refer to the same components.

In the disclosure, it may be understood that each block of processing flowchart drawings and combinations of flowchart drawings may be performed by computer program instructions. Since the computer program instructions may be mounted on a general purpose computer, a special purpose computer, or a processor of other programmable data processing equipment, the instructions performed through the computer, or the processor of other programmable data processing equipment may generate a means of performing the functions described in flow block(s). Since the computer program instructions may be stored in a computer available or computer readable memory, which may be directed to a computer or other programmable data processing equipment, to implement a function in a particular manner, the instructions stored in the computer-available or the computer-readable memory may produce manufactured items including an instruction for performing the function described in flow block(s). Since computer program instructions may also be mounted on computers or other programmable data processing equipment, the instructions may provide steps for executing the functions described in flowchart block(s), wherein the instruction performs a series of operation steps on the computer or the other programmable data processing equipment to generate a process executed by a computer, thereby performing the computer or the other programmable data processing equipment.

Each block may also indicate a module, a segment, or part of a code including one or more executable instructions for executing a specific logical function(s). It should also be noted that in various embodiments, it is possible for the functions mentioned in the blocks to occur out of order. For example, two blocks shown one after another may actually be performed substantially simultaneously, or it is also possible that blocks are sometimes performed in reverse order according to the corresponding function.

In the disclosure, the term '~unit' may refer to a software or a hardware component such as FPGA, or ASIC, and '~unit' performs certain roles. However, '~unit' is not limited to software or hardware. The '~unit' may be configured to be on an addressable storage medium or to play one or more processors. Accordingly, '~unit' includes components such as software components, object-oriented software components, class components, and task components, processes, functions, properties, procedures, subroutines, segments of program code, drivers, firmware, microcode, circuit, data, databases, data structures, tables, arrays, and variables, as an example. Components and functions provided within '~units' may be combined into a smaller number of components and '~units' or further separated into additional components and '~units'. In addition, components and '~units' may be implemented to play one or more CPUs in a device or secure multimedia card.

Hereinafter, various example embodiments will be described in greater detail with reference to the accompanying drawings. It should be noted that the same components are indicated by the same reference numbers in the accompanying drawings. In addition, it should be noted that the drawings of the present disclosure are provided to aid in the understanding of the present disclosure, and the present disclosure is not limited to the form or arrangement illustrated in the drawings. In addition, detailed descriptions of well-known functions and configurations that may obscure the gist of the present disclosure may be omitted.

FIG. 1 is a block diagram illustrating an example configuration of a wireless communication system according to various embodiments. FIG. 1 may be a part of a devices or nodes using a wireless channel in a wireless communication system, and illustrates a transmission end 110 and a reception end 120. FIG. 1 illustrates one transmission end 110 and one reception end 120, but may include a plurality of transmission ends or a plurality of reception ends. In addition, for convenience of description, in the present disclosure, the transmission end 110 and the reception end 120 are described as separate objects, but functions of the transmission end 110 and the reception end 120 may be changed. For example, in the case of an uplink of the cellular communication system, the transmission end 110 may be a terminal, and the reception end 120 may be a base station. In the case of a downlink, the transmission end 110 may be a base station and the reception end 120 may be a terminal. In the case of a side link, both the transmission end 110 and the reception end 120 may be terminals.

In various embodiments, the transmission end 110 may generate a codeword by encoding information bits based on the turbo code, and the reception end 120 may decode a received signal of the codeword based on the turbo code. For example, the reception end 120 may effectively decode a signal encoded with a turbo code by performing post-processing based on whether turbo decoding is successful and a code parameter (code dimension, code length, code rate).

Figure 2:
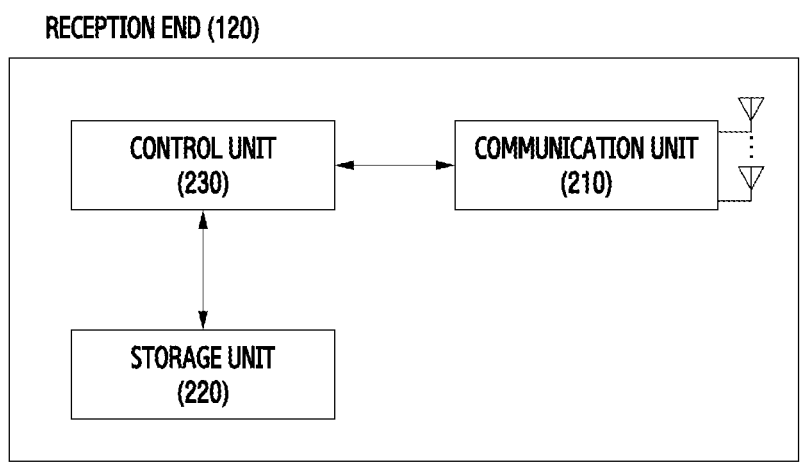
FIG. 2 is a block diagram illustrating an example configuration of a device for performing communication in a wireless communication system according to embodiments.

FIG. 2 is a block diagram illustrating an example configuration of a device for performing communication in a wireless communication system according to various embodiments. For example, the configuration illustrated in FIG. 2 may be understood as the configuration of the reception end 120. Terms such as '~unit,'~er' used hereinafter refer to units for processing at least one function or operation, which may be implemented by hardware, software, or a combination of hardware and software.

Referring to FIG. 2, the device may include a communication unit (e.g., including communication circuitry) 210, a storage unit (e.g., a memory) 220, and a control unit (e.g., including processing and/or control circuitry) 230.

The communication unit 210 may include various communication circuitry and perform functions for transmitting and receiving signals through a wireless channel. For example, the communication unit 210 may perform a conversion function between a baseband signal and a bit string according to a physical layer standard of the system. For example, when transmitting data, the communication unit 210 may generate complex symbols by encoding and modulating a transmission bit string. In addition, when receiving data, the communication unit 210 may restore the reception bit string through demodulation and decoding of the baseband signal. In addition, the communication unit 210 may up-convert the baseband signal into a radio frequency (RF) band signal, and then transmit the RF band signal received through an antenna, and down-convert the RF band signal into the baseband signal through the antenna.

To this end, the communication unit 210 may include various communication circuitry including, for example, a transmission filter, a reception filter, an amplifier, a mixer, an oscillator, a digital to analog converter (DAC), an analog to digital converter (ADC), and the like. In addition, the communication unit 210 may include a plurality of transmission/reception paths. Furthermore, the communication unit 210 may include at least one antenna array including a plurality of antenna elements. In terms of hardware, the communication unit 210 may include a digital unit and an analog unit, and the analog unit may include a plurality of sub-units according to operating power, operating frequency, and the like. In addition, the communication unit 210 may include a decoding unit to perform decoding according to various embodiments of the present disclosure.

The communication unit 210 may transmit and/or receive a signal as described above. Accordingly, the communication unit 210 may be referred to as a 'transmission unit', a 'reception unit', or a 'transceiver'. In addition, in the following description, transmission and reception performed through a wireless channel are used as meaning including the processing as described above performed by the communication unit 210. In addition, when the device of FIG. 2 is a base station, the communication unit 210 may further include a backhaul communication unit for communication with other network objects connected through a backhaul network.

The storage unit 220 may include, for example, a memory, and store data such as a basic program, an application program, and setting information for the operation of the reception end 120. The storage unit 220 may include a volatile memory, a nonvolatile memory, or a combination of a volatile memory and a nonvolatile memory. In addition, the storage unit 220 may provide stored data according to a request from the control unit 230.

The control unit 230 may include various processing and/or control circuitry and control overall operations of the device. For example, the control unit 230 may transmit and receive a signal through the communication unit 230. Also, the control unit 230 may record or read data in the storage unit 220. To this end, the control unit 230 may include at least one processor or a microprocessor, or may be a part of the processor. According to various embodiments, the control unit 230 may control the device to perform operations according to various embodiments to be described later.

A turbo code may refer, for example, to a code generated by concatenating two convolution codes in parallel, and an encoding process of the turbo code will be briefly described below for understanding the present disclosure.

Figure 3:
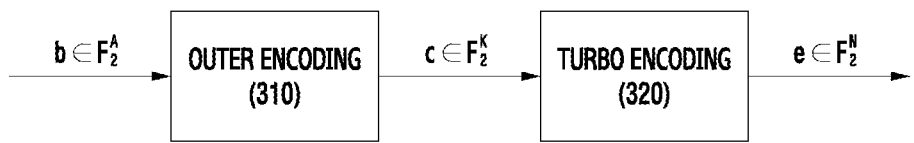
FIG. 3 is a block diagram illustrating an example of encoding a concatenated turbo code according to embodiments.

FIG. 3 is a diagram illustrating an example of encoding a concatenated turbo code according to various embodiments.

An information bit sequence $b \in \mathbb{F}_2^A$ of a length 'A' to be transmitted is illustrated. Here, $\mathbb{F}_2$ is a binary field. This information bit sequence 'b' may be a part of the entire information bits to be transmitted, or the entire information bit sequence. In a general concatenated turbo code system, the information bit sequence $c \in \mathbb{F}_2^K$ may be encoded with an outer code 310 prior to turbo coding to generate a turbo coded input bit sequence of length K. Here, K is referred to as the code dimension of the turbo code. For example, in the 3GPP LTE system, two types of CRC codes are selectively used depending on whether code block segmentation is performed, and the two types of CRC codes generate a CRC parity bit of 24 bits in common. In other words, in this system, the code dimension K becomes A+24. A turbo encoder may receive an input bit sequence c of the code dimension K encoded with the outer code, and encode it with a turbo code (320) to generate the codeword bit sequence $e \in \mathbb{F}_2^N$ of the code length N, and then transmit it by performing modulation, channel interleaving, and the like.

The length of the input bit sequence of the turbo code (including the parity bit of the outer concatenated code) may refer, for example, to the code dimension, and the symbol is written as K. The length of the output bit sequence of the turbo code, for example, the codeword bit sequence, may refer, for example, to the code length, and is written as N symbolically.

Hereinafter, a turbo encoding process will be described in greater detail based, by way of non-limiting example, on the turbo code used in the 3GPP LTE system [TS36.212].

Figure 4:
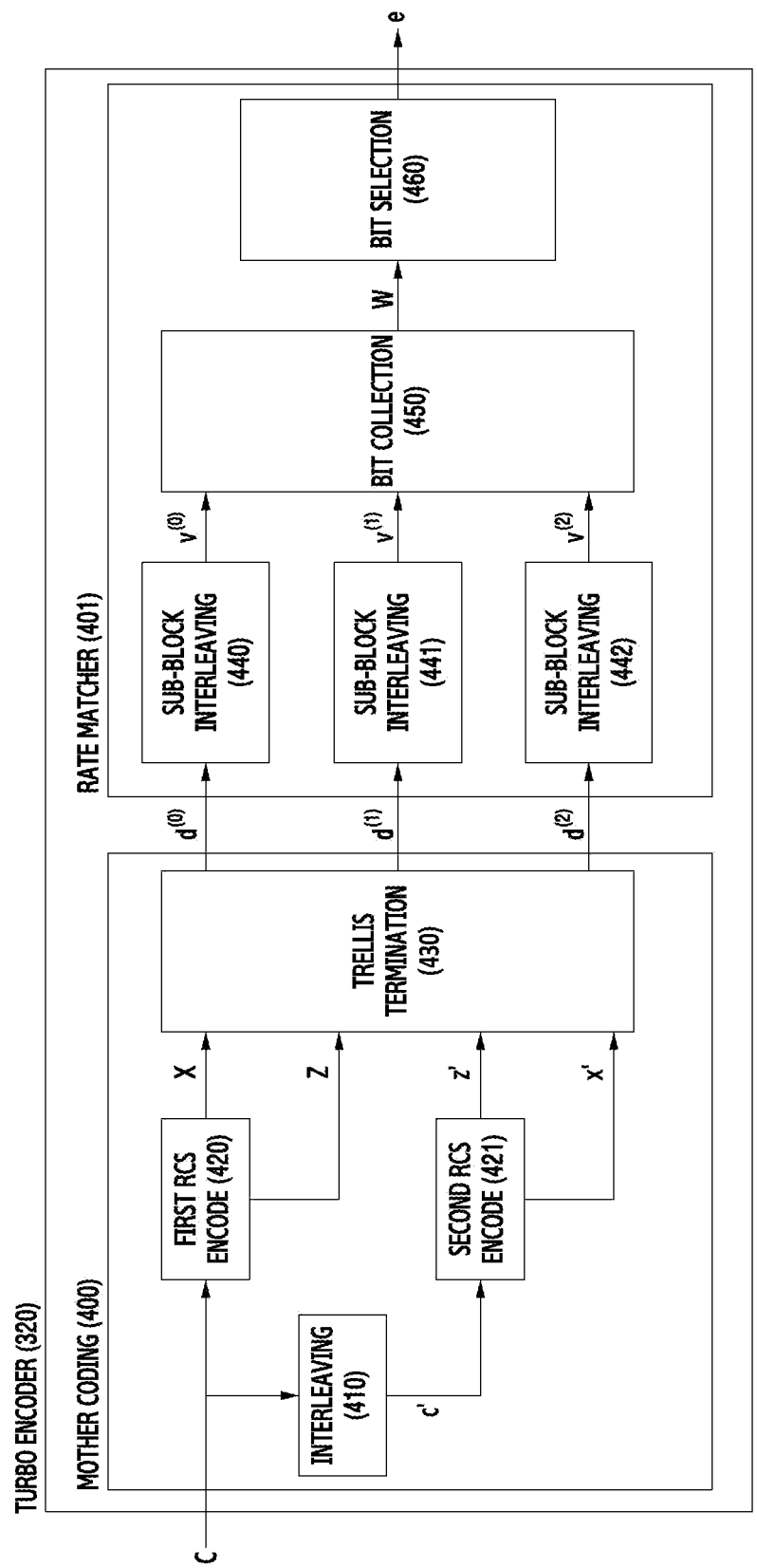
FIG. 4 is a block diagram illustrating an example configuration of a turbo encoder configured to perform an encoding operation of a turbo code according to embodiments.

FIG. 4 is a block diagram illustrating an example configuration of a turbo encoder configured to perform an encoding operation of a turbo code according to embodiments.

The turbo encoder 320 may include a mother coding unit 400 for creating a codeword corresponding to a mother code and a rate matcher 401 for adjusting the codeword to a codeword corresponding to a target encoding rate.

The turbo encoder generates four bit sequences x, z, x', z' using an encoder of two convolutional codes with the input bit sequence c. The convolutional code used here may be classified as a recursive systematic convolutional (RCS) code, and the two encoders will be referred to as a first RCS encoder 420 and a second RSC encoder 421, respectively. In general, the two RSC encoders are identical and receive different inputs and produce different output sequences. The RSC encoders are usually implemented with a linear feedback shift register (LFSR). The LTE turbo coding system is implemented as an RSC encoder in which the number of LFSR registers m is defined as 3.

The first RCS encoder 420 may generate two sequences $x \in \mathbb{F}_2^{K'}$ and $x \in \mathbb{F}_2^{K'}$ of length K' based on the input bit sequence $c \in \mathbb{F}_2^K$. Herein, the length K' is greater than the code dimension K. Herein, x is a systematic bit sequence including c, and z is a parity bit sequence generated by the first RSC encoder. The RSC encoder performs zero-tail termination to match the initial state and the final state to zero on a trellis diagram, and specifically, it is a process of generating additional bits by inputting 0 as much as m, the number of LFSR memories. As a result of this zero-tail termination, the length K' of x and z becomes K+m. In detail, c is mapped to the first K bits in the systematic bit sequence $x=(x_0, x_1, \ldots x_{K+m-1})$. In other words, for $i \in \{0, \ldots, K-1\}$, $x_i \leftarrow c_i$. The last m bits $x_K, x_{K+1}, \ldots, x_{K+m-1}$ are generated by zero-tail termination of the first RSC encoder. The parity bit sequence z is also generated considering up to the last m 0-bit inputs.

The second RSC encoder 421 may generate two sequences $x' \in \mathbb{F}_2^{K'}$ and $z' \in \mathbb{F}_2^{K'}$ of length K' based on the bit sequence $c' \in \mathbb{F}_2^K$ obtained by interleaving (change the order of the bits according to the set rules) (410) the input bit sequence c. The second RSC encoder 421 performs the operations in the same way as the first RSC encoder 420, except only c' which is a result of interleaving of the input bit sequence. Similarly, the length K' of x' and z' becomes K+m. The first K bits of the systematic bit sequence x' generated by the second RSC encoder are also generated by directly mapping of c', and the last m bits are generated by zero-tail termination. Accordingly, the first K bits of the systematic bit sequence generated by the first RSC encoder and the second RSC encoder are the same sequence only different in order, and the last m bits are distinguished from each other.

The trellis termination unit 430 combines x, z, x', z' generated by the two RSC encoders to generate a codeword corresponding to the mother code. As described above, x and x' may include the same elements, except for the last m bits generated by zero-tail termination, only different in order. Thus, the total number of significant bits is 3(K+m) bits in m and m bits generated by the trellis termination of x', totaling 3K+4m bits. Since it is m=3 in the LTE turbo code system, it becomes a total of 3K+12. In the trellis termination unit, the first K bits of each of the three sequences m are used as a base bit sequence, and an operation of attaching 4m bits generated by zero-tail termination is performed according to established rules, following the three base bit sequences. Based on this, three subblock bit sequences $d^{(0)}$, $d^{(1)}$, $d^{(2)}$ are generated. The length of each sub-block bit sequence is written as D and becomes D=K+(4m/3). In the LTE turbo code system, D=K+4. These sequences are transmitted to the code rate adjustment unit 401 and are used as a code sequence of a mother code that generates a bit sequence of a length to be finally transmitted.

Each of the sub-block bit sequences $d^{(0)}$, $d^{(1)}$, $d^{(2)}$ is interleaved by a predetermined (e.g., specified) rule. This process is referred to as sub-block interleaving 440, 441, and 442. In the LTE turbo code system, $d^{(0)}$, $d^{(1)}$ is interleaved with the same rule (440 and 441), and $d^{(2)}$ is interleaved with the modified rule (442). The sub-block interleaving process initiates by storing the input $d^{(i)}$ (i=0, 1, 2) in a rectangular buffer in a row-first manner. At this time, the number of columns C of the rectangular buffer to be used is fixed to 32, and the number of rows R, is determined as the smallest number that the buffer can include all the bits of $d^{(i)}$, that is R=⌈D/C⌉. The size of the rectangular buffer is to be written as $K_\pi$, which becomes $K_\pi = R \times C = \lceil D/C \rceil \times C$. Since the size $K_\pi$ of the rectangular buffer is equal to or greater than the length D of the input bit sequence $d^{(i)}$, the elements in the first $K_\pi - D$ column of the first row are filled with NULL values to fill the difference. And from the next column, the bits of $d^{(i)}$ are sequentially filled in a row-priority manner. The process may be modified by placing a shift for $d^{(2)}$. When the rectangular matrix is filled in this way, the columns of the rectangular matrix are mixed in a given order, which is called inter-column permutation. After mixing the columns of the rectangular matrix, the final output sequence is generated by reading the elements from the buffer in a column-first manner. The process may be implemented using an actual rectangular matrix, or may be implemented by immediately calculating and mapping an index of a bit in consideration of such a process. A bit sequence obtained by interleaving each subblock bit sequence $d^{(0)}$, $d^{(1)}$, $d^{(2)}$ by the process is written as $v^{(0)}$, $v^{(1)}$, $v^{(2)}$.

Collecting $v^{(0)}$, $v^{(1)}$, $v^{(2)}$ obtained by sub-block interleaving through the process and accumulating them in a virtual circular buffer is called a bit collection 450. The size $K_w$ of the circular buffer is $K_w=3K_\pi$. First, the bits of $v^{(0)}$ are stored sequentially from position 0 of the circular buffer. Each bit of $v^{(1)}$ and $v^{(2)}$ is extracted by interlacing in order and stored in the circular buffer. In this way, a circular buffer sequence w of length $K_w$ is completed. In this case, a limited buffer may be operated in consideration of the performance of the terminal/equipment, and this case is referred to as limited-buffer rate-matching (LBRM). In this case, it may be readjusted to a sequence closer to the target length by adjusting the circular buffer sequence w. The length of the finally determined circular buffer sequence is referred to as $N_{cb}$, and when the LBRM is used, it becomes $N_{cb} < K_w$. Otherwise, it is $N_{cb}=K_w$.

N bits to be transmitted are selected from the last given circular buffer sequence w, it is called bit selection or circular buffer rate-matching (CB-RM) (460). When a redundancy version (RV) $rv_{idx}$ in consideration of hybrid automatic repeat-and-request (HARQ) is received from a higher layer operation, a starting position $k_0$ is determined from where to read the circular buffer. $k_0$ may be directly received instead of $rv_{idx}$ from a higher layer. Bits are sequentially extracted from the determined starting position $k_0$ of the circular buffer sequence w. The NULL value generated in the subblock interleaving is skipped, and when the end of the circular buffer sequence w is reached, the pointer is readjusted to the first index to extract the bit. Since this process reads while cycling the w sequence, it is called a virtual circular buffer. The final codeword bit sequence $e \in \mathbb{F}_2^N$ is generated by creating N bits to be transmitted through this series of operations, based on this, a post-process such as modulation and channel interleaving is performed to transmit a signal.

The codeword bit sequence e of arbitrary length N may be obtained from the encoding input sequence c of the given length K by the series of turbo encoding processes. The final target code rate becomes R=K/N. As described above, in the case of the LTE taboo code system, when LBRM is not used, the mother code length is 3K+12, and the code rate of the mother code is R'=K/(3K+12), about ⅓. When the target code rate $\hat{K}$ is greater than the mother code rate R', some bits of the generated codeword are not transmitted. By generating the codeword bit in this way, but not transmitting it, reducing the length of the code is called puncturing, bits that are not transmitted are called punctured bits. On the other hand, when the target code rate $\hat{K}$ is less than the mother code rate R', some of the generated code word bits are selected and transmitted more than once in the CB-RM process. Increasing the code length by selecting and transmitting some or all of the code bits of the mother code generated in this way more than once is called repetition.

In the present disclosure, a situation in which the target code rate $\hat{K}$ is high (the code length N is smaller than 3K+12) and a plurality of codeword bits generated from the mother code are punctured is considered. When a plurality of codeword bits are punctured, the characteristics of the mother code, which were considered when designing the system, are changed. Therefore, an unexpected problem occurs, and in the present disclosure, the following problems are to be found and addressed.

Figure 5:
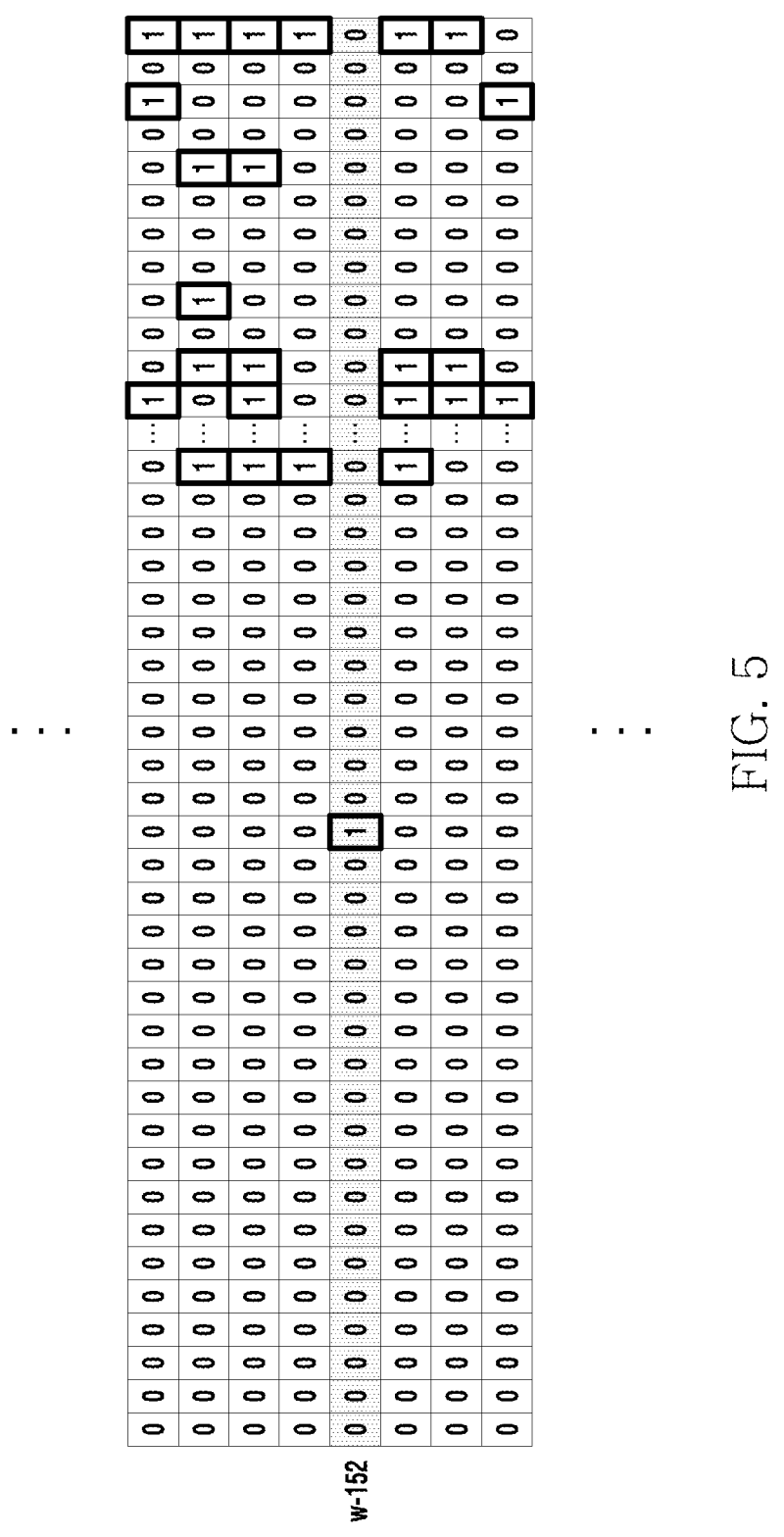

FIG. 5 is a diagram illustrating a part of a generator matrix $\hat{v}$ configured in an example of an LTE turbo code system according to embodiments. The generation matrix $G \in \mathbb{F}_2^{K \times N}$ defines linear transformation from a given encoded input bit sequence (vector) c to a codeword bit sequence (vector) e. In other words, when the series of encoding processes are performed, the conversion of e from c can be defined by Equation 1 below.

$$e=cG \qquad \text{[Equation 1]}$$

In Equation 1, c and e are expressed as row vectors of length K and N, respectively. Although the turbo code are not usually defined using the generation matrix G, the generation matrix G may be simply obtained by setting the input vector to one-hot vector (a vector with a value of 1 for only the designated position and zero for all others) and observing the output vector, when the turbo encoding system as described above is given. The generation matrix G obtained by the process is useful for checking the characteristics of the code because it reflects all the actions performed by the turbo code (encoding, encoding rate adjustment, interleaving, and the like).

FIG. 5 is a diagram illustrating a part of a generation matrix configured when a code dimension is 160 and a code length is 204 in a 3GPP LTE turbo code system according to embodiments.

For example, FIG. 5 illustrates a sub-matrix of a part corresponding to rows 148 to 155 of the generation matrix $G \in \mathbb{F}_2^{160 \times 204}$ when the code dimension is 160 and the code length is 204. Herein, it should be noted that indexes of row and column are determined based on zero-based numbering in which the first element is mapped to the 0th index. In this code, the target code rate is very high as $$R = \frac{160}{204} = 0.7843,$$

and 288 bits are punctured in the mother code of 160×3+12=492 to obtain codeword bits with a code length of 204. As described above, when a plurality of code word bits of the mother code are punctured due to the high code rate, the characteristics of the mother code considered during the design are deformed, and an unexpected problem may occur. This unexpected problem may be identified from the generation matrix G of FIG. 5. When observing the generation matrix G including the parameters, in the row 152th, only one column that is element "1" is exist, and the value of all other columns is element "0". This may refer, for example, to the 152th bit among the bits of the encoding input bit sequence c not being involved in generating any parity bit. This may refer, for example, to the 152th bit not obtaining extrinsic information from any other bit in the process of iterative decoding of the turbo code. In other words, even when turbo encoding, 152th bit of c remains uncoded due to excessive puncturing, and the performance of the turbo code is determined solely by how much of this single bit is damaged in the channel. For example, even when i−1 bits among K bits of c are normally estimated by decoding of the turbo code, the entire decoding may fail due to one uncoded bit.

Figure 6:
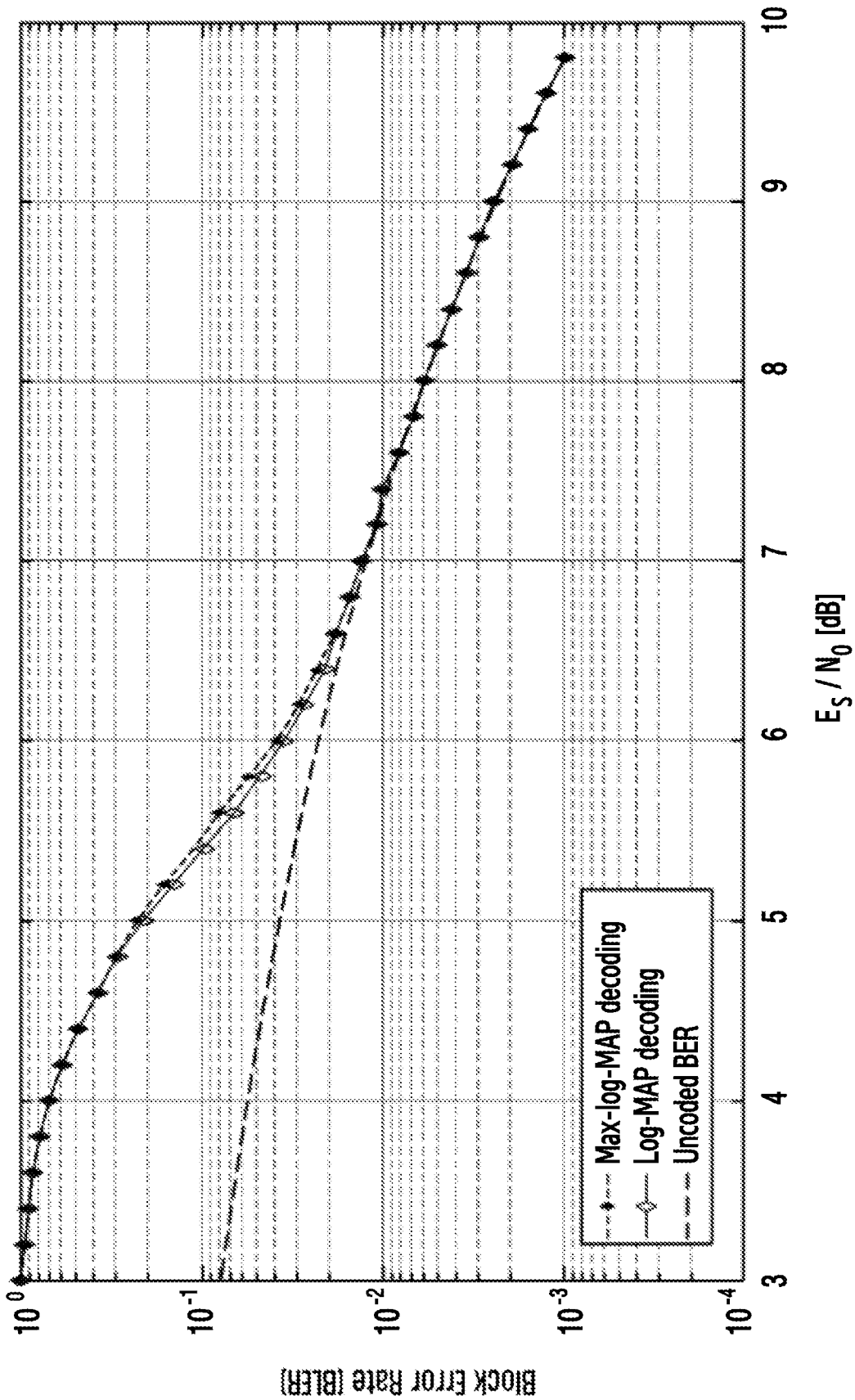
FIG. 6 is a graph illustrating a performance degradation in an AWGN (additive white Gaussian noise) channel when a code dimension is 160 and a code length is 204 in a 3GPP LTE turbo code system according to embodiments.

FIG. 6 is a graph illustrating a performance degradation in an AWGN channel when a code dimension is 160 and a code length is 204 in a 3GPP LTE turbo code system according to embodiments.

For example, FIG. 6 illustrates performance in an additive white Gaussian noise (AWGN) channel of the LTE turbo code of the code dimension 160 and the code length 204 described in FIG. 5. As modulation techniques, quadrature phase shift keying (QPSK) is considered, and as turbo decoding algorithms, approximated low-complexity max-log-MAP, which is typically used, and high-complexity but optimal log-MAP are considered. The quality of a channel is measured by the signal-to-noise ratio (SNR), and herein, it is expressed as $E_s/N_0$ obtained by dividing the energy of the modulation symbol by the power spectral density of the noise. In addition, the bit error rate (BER) at each $E_s/N_0$ when the bits are transmitted without any processing through QPSK modulation, that is, when not encoded, are also shown. As shown in FIG. 6, it may be confirmed that the performance of the two decoding algorithms for the turbo code is bound to the BER curve of one bit, even when the SNR, which is the quality of the AWGN channel, increases. This is a serious problem, and it indicates that encoding using a turbo code at the transmitter and performing complex iterative decoding at the receiver does not produce any gain because of a single bit.

In order to address the above problem, it is confirmed whether the above-described "problem in which the encoding input bit is not encoded" occurs in a combination of all code dimensions and code lengths of the 3GPP LTE turbo codes. For example, it constructs a generation matrix for the given code parameters (code dimension, code length, code rate), and identify the existence of a row with only one column with element "1". It should be noted that this confirmation process is not actually performed in the operation of the present disclosure, but is a one-time pre-work for designing a system in which an embodiment of the present disclosure is performed. In other words, in performing an embodiment of the disclosure, the receiver may not actually perform an operation of identifying whether a specific encoding input bit is not encoded, and may perform decoding on the premise that the result of the corresponding confirmation process is known in advance. Table 1 below shows the code dimension K, the code length N, and a code rate R=K/N depending on that, in which the above-described "problem that coding input bit is not encoded" occurs in the LTE turbo coding system. In addition, when the problem occurs, an index of bits that remain unencoded is also described. Herein, the bit index is described based on zero-based numbering in which the first element is mapped to index 0.

TABLE 1

| Code Dimension $K$ | Code Length $N$ | Code rate $R$ | Uncoded bit index |
|---|---|---|---|
| 48 | 52 | 0.9231 | 40 |
| 48 | 53 | 0.9057 | 40 |
| 48 | 54 | 0.8889 | 40 |
| 48 | 55 | 0.8727 | 40 |
| 48 | 56 | 0.8571 | 40 |
| 48 | 57 | 0.8421 | 40 |
| 48 | 58 | 0.8276 | 40 |
| 48 | 59 | 0.8136 | 40 |
| 48 | 60 | 0.8000 | 40 |
| 48 | 61 | 0.7869 | 40 |
| 48 | 62 | 0.7742 | 40 |
| 48 | 63 | 0.7619 | 40 |
| 48 | 64 | 0.7500 | 40 |
| 48 | 65 | 0.7385 | 40 |
| 72 | 76 | 0.9474 | 57 |
| 72 | 77 | 0.9351 | 57 |
| 72 | 78 | 0.9231 | 57 |
| 72 | 79 | 0.9114 | 57 |
| 80 | 84 | 0.9524 | 72 |
| 80 | 85 | 0.9412 | 72 |
| 80 | 86 | 0.9302 | 72 |
| 80 | 87 | 0.9195 | 72 |
| 80 | 88 | 0.9091 | 72 |
| 80 | 89 | 0.8989 | 72 |
| 80 | 90 | 0.8889 | 72 |
| 80 | 91 | 0.8791 | 72 |
| 80 | 92 | 0.8696 | 72 |
| 80 | 93 | 0.8602 | 72 |
| 80 | 94 | 0.8511 | 72 |
| 80 | 95 | 0.8421 | 72 |
| 80 | 96 | 0.8333 | 72 |
| 80 | 97 | 0.8247 | 72 |
| 80 | 98 | 0.8163 | 72 |
| 80 | 99 | 0.8081 | 72 |
| 80 | 100 | 0.8000 | 72 |
| 80 | 101 | 0.7921 | 72 |
| 80 | 102 | 0.7843 | 72 |
| 80 | 103 | 0.7767 | 72 |
| 80 | 104 | 0.7692 | 72 |
| 80 | 105 | 0.7619 | 72 |
| 80 | 106 | 0.7547 | 72 |
| 80 | 107 | 0.7477 | 72 |
| 88 | 92 | 0.9565 | 66 |
| 88 | 93 | 0.9462 | 66 |
| 88 | 94 | 0.9362 | 66 |
| 88 | 95 | 0.9263 | 66 |
| 120 | 126 | 0.9524 | 105 |
| 120 | 127 | 0.9449 | 105 |
| 120 | 128 | 0.9375 | 105 |
| 120 | 129 | 0.9302 | 105 |
| 160 | 167 | 0.9581 | 152 |
| 160 | 168 | 0.9524 | 152 |
| 160 | 169 | 0.9467 | 152 |
| 160 | 170 | 0.9412 | 152 |
| 160 | 171 | 0.9357 | 152 |
| 160 | 172 | 0.9302 | 152 |
| 160 | 173 | 0.9249 | 152 |
| 160 | 174 | 0.9195 | 152 |
| 160 | 175 | 0.9143 | 152 |
| 160 | 176 | 0.9091 | 152 |
| 160 | 177 | 0.9040 | 152 |
| 160 | 178 | 0.8989 | 152 |
| 160 | 179 | 0.8939 | 152 |
| 160 | 180 | 0.8889 | 152 |
| 160 | 181 | 0.8840 | 152 |
| 160 | 182 | 0.8791 | 152 |
| 160 | 183 | 0.8743 | 152 |
| 160 | 184 | 0.8696 | 152 |
| 160 | 185 | 0.8649 | 152 |
| 160 | 186 | 0.8602 | 152 |
| 160 | 187 | 0.8556 | 152 |
| 160 | 188 | 0.8511 | 152 |
| 160 | 189 | 0.8466 | 152 |
| 160 | 190 | 0.8421 | 152 |
| 160 | 191 | 0.8377 | 152 |
| 160 | 192 | 0.8333 | 152 |
| 160 | 193 | 0.8290 | 152 |
| 160 | 194 | 0.8247 | 152 |
| 160 | 195 | 0.8205 | 152 |
| 160 | 196 | 0.8163 | 152 |
| 160 | 197 | 0.8122 | 152 |
| 160 | 198 | 0.8081 | 152 |
| 160 | 199 | 0.8040 | 152 |
| 160 | 200 | 0.8000 | 152 |
| 160 | 201 | 0.7960 | 152 |

TABLE 1-continued

| Code Dimension $^K$ | Code Length $^N$ | Code rate $^R$ | Uncoded bit index |
|---|---|---|---|
| 160 | 202 | 0.7921 | 152 |
| 160 | 203 | 0.7882 | 152 |
| 160 | 204 | 0.7843 | 152 |
| 160 | 205 | 0.7805 | 152 |
| 160 | 206 | 0.7767 | 152 |
| 160 | 207 | 0.7729 | 152 |
| 160 | 208 | 0.7692 | 152 |
| 160 | 209 | 0.7656 | 152 |
| 160 | 210 | 0.7619 | 152 |
| 160 | 211 | 0.7583 | 152 |
| 160 | 212 | 0.7547 | 152 |
| 160 | 213 | 0.7512 | 152 |
| 208 | 217 | 0.9585 | 200 |
| 208 | 218 | 0.9541 | 200 |
| 208 | 219 | 0.9498 | 200 |
| 208 | 220 | 0.9455 | 200 |
| 208 | 221 | 0.9412 | 200 |
| 208 | 222 | 0.9369 | 200 |
| 208 | 223 | 0.9327 | 200 |
| 208 | 224 | 0.9286 | 200 |
| 208 | 225 | 0.9244 | 200 |
| 208 | 226 | 0.9204 | 200 |
| 208 | 227 | 0.9163 | 200 |
| 208 | 228 | 0.9123 | 200 |
| 208 | 229 | 0.9083 | 200 |
| 208 | 230 | 0.9043 | 200 |
| 208 | 231 | 0.9004 | 200 |
| 208 | 232 | 0.8966 | 200 |
| 208 | 233 | 0.8927 | 200 |
| 208 | 234 | 0.8889 | 200 |
| 208 | 235 | 0.8851 | 200 |
| 208 | 236 | 0.8814 | 200 |
| 208 | 237 | 0.8776 | 200 |
| 208 | 238 | 0.8739 | 200 |
| 208 | 239 | 0.8703 | 200 |
| 208 | 240 | 0.8667 | 200 |
| 208 | 241 | 0.8631 | 200 |
| 208 | 242 | 0.8595 | 200 |
| 208 | 243 | 0.8560 | 200 |
| 208 | 244 | 0.8525 | 200 |
| 208 | 245 | 0.8490 | 200 |
| 208 | 246 | 0.8455 | 200 |
| 208 | 247 | 0.8421 | 200 |
| 208 | 248 | 0.8387 | 200 |
| 208 | 249 | 0.8353 | 200 |
| 208 | 250 | 0.8320 | 200 |
| 208 | 251 | 0.8287 | 200 |
| 208 | 252 | 0.8254 | 200 |
| 208 | 253 | 0.8221 | 200 |
| 208 | 254 | 0.8189 | 200 |
| 208 | 255 | 0.8157 | 200 |
| 208 | 256 | 0.8125 | 200 |
| 208 | 257 | 0.8093 | 200 |
| 208 | 258 | 0.8062 | 200 |
| 208 | 259 | 0.8031 | 200 |
| 208 | 260 | 0.8000 | 200 |
| 208 | 261 | 0.7969 | 200 |
| 208 | 262 | 0.7939 | 200 |
| 208 | 263 | 0.7909 | 200 |
| 208 | 264 | 0.7879 | 200 |
| 208 | 265 | 0.7849 | 200 |
| 208 | 266 | 0.7820 | 200 |
| 208 | 267 | 0.7790 | 200 |
| 208 | 268 | 0.7761 | 200 |
| 208 | 269 | 0.7732 | 200 |
| 208 | 270 | 0.7704 | 200 |
| 208 | 271 | 0.7675 | 200 |
| 208 | 272 | 0.7647 | 200 |
| 208 | 273 | 0.7619 | 200 |
| 208 | 274 | 0.7591 | 200 |
| 208 | 275 | 0.7564 | 200 |

In the disclosure, it is confirmed that the following features are present by analyzing the exhaustively identified results for the LTE turbo coding system as shown in Table 1. The code dimension K is one of the seven values {48, 72, 80, 88, 120, 160, 208}. In addition, the above problem occurs only when the code rate R is about 0.75 or more. When the code dimension K is the same, the index of non-encoded bits is always determined the same regardless of the code length N and the code rate K̂. For example, a bit index that is not encoded with respect to the code dimension K is determined as shown in Table 2 below.

TABLE 2

| code dimension $^K$ | Uncoded bit index |
|---|---|
| 48 | 40 |
| 72 | 57 |
| 80 | 72 |
| 88 | 66 |
| 120 | 105 |
| 160 | 152 |
| 208 | 200 |

As described above, a problem in which some bits are not coded in a specific code parameter is observed, and a situation in which such a shape caused some problem in an actual environment is confirmed. Embodiments of the disclosure provide a method for addressing the above problem at a level that hardly increases the complexity and introduction of new components compared to existing systems.

Iteration decoding performed for a turbo code will be briefly described.

Figure 7:
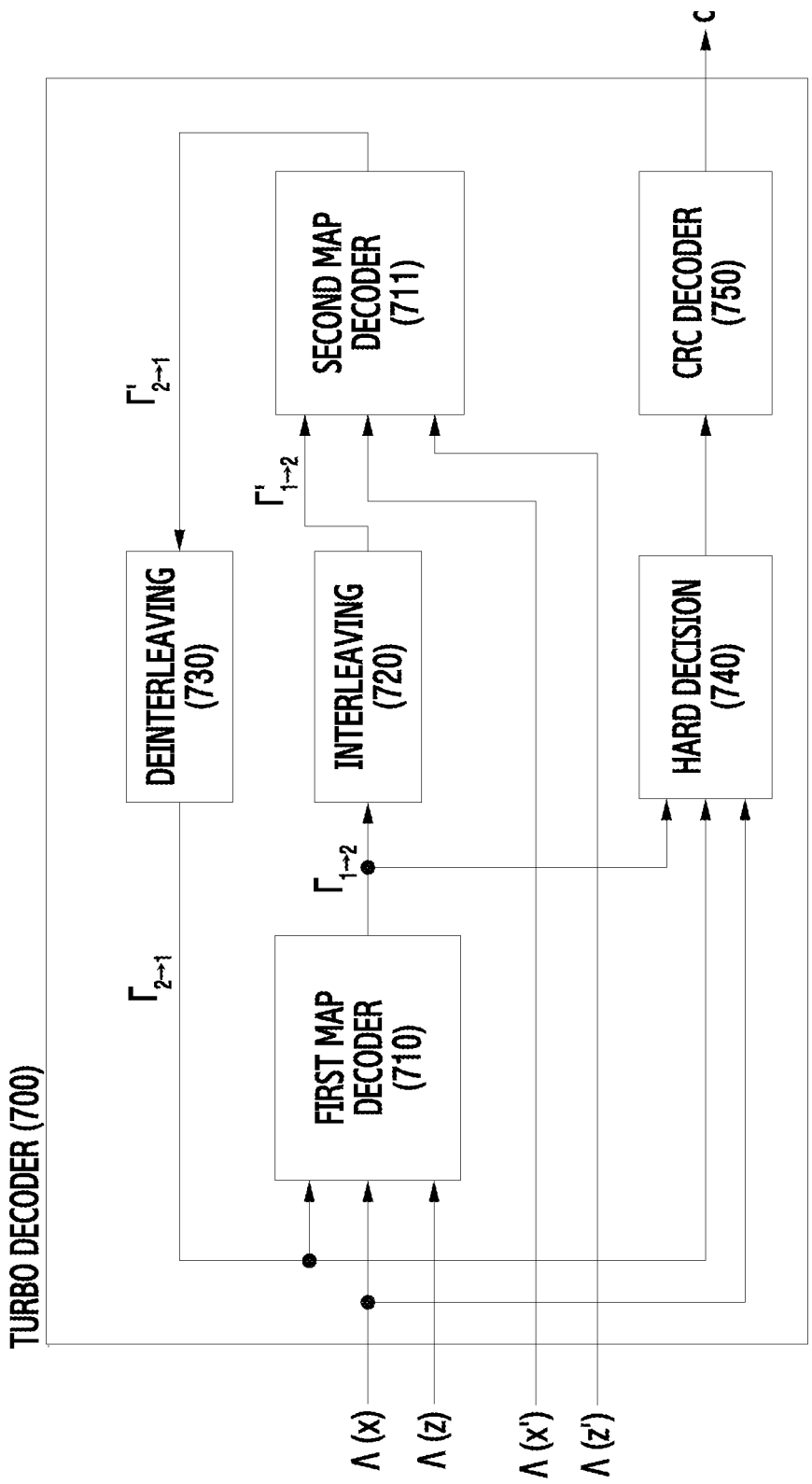
FIG. 7 is a block diagram illustrating an example configuration of a decoder of a concatenated turbo code according to embodiments.

FIG. 7 is a block diagram illustrating an example configuration of a decoder for a concatenated turbo code according to embodiments.

The receiver obtains a log likelihood ratio (LLR) for the codeword bits of the mother code by processing the transmitted signal with demodulation, derate matching, or subblock deinterleaving. A demodulation, derate matching, or subblock deinterleaving performed by the receiver, may be understood as an inverse process that pairs with demodulation, derate matching, or subblock deinterleaving performed by the transmitter. And LLR is a value obtained by taking the log of the ratio of the probability for a given observation (received symbol, etc.) under the condition that bit values are 0 and 1. For example, for bit $x_i$, the LLR value $\lambda(x_i)$ in the presence of y as a result of observation in a given receiver is defined as Equation 2 below.

$$\lambda(x_i) = \log \frac{Pr(y \mid x_i = 0)}{Pr(y \mid x_i = 1)} \quad \text{[Equation 2]}$$

When $x_i$ is perforated in the above equation, $\lambda(x_i)$ becomes zero because the receiver cannot obtain any information about $x_i$. When XXXXX is iterated more than once, the entire LLR can be obtained by combining each generated LLR based on the observation result of the iterated bits (combining, in this case, the addition of LLRs).

The receiver obtains the LLR sequence $\Lambda(x)$, $\Lambda(z)$, $\Lambda(x')$, $\Lambda(z')$ for the four bit sequence x, z, x', z' for the mother code generated by the turbo encoder of the transmitter through the above series of operations. For example, $\Lambda(x)$ is configured with $(\lambda(x_0), \lambda(x_1), \ldots \lambda(x_{g+m-1}))$, and also, $\Lambda(z)$, $\Lambda(x')$, $\Lambda(z')$ is obtained in the same format. The turbo decoder 700 operates by inputting these four LLR sequences. The turbo decoder 700 may include two internal maximum a posteriori (MAP) decoders, each referred to as a first MAP decoder 710 and a second MAP decoder 711. The first MAP decoder 710 is used to process bit sequences x and z generated by the first RSC encoder 420 of the transmitter, and the second decoder 711 is used to process bit sequences x' and z' generated by the second RSC encoder 421 of the transmitter.

The two MAP decoders alternately perform iteration operations, and such iteration decoding can operate as many as a predetermined maximum number of iterations (maximum iteration). Each iteration decoding is configured with a series of sequence of component operations. For example, in an embodiment, one iteration decoding is configured in the order of (first MAP decoding—second MAP decoding—hard decision—decoding of an external concatenated code). Here, the hard decision 740 is a process of obtaining ĉ, which is an estimate of the encoding input bit sequence c, based on the MAP decoding result. Since the estimation ĉ is a code word of the concatenated external code, the validity of the estimation ĉ may be determined by performing decoding (750) of the external concatenated code (e.g., CRC code). When the estimated ĉ passes a inspection through decoding of the external concatenated code such as a CRC code, it is determined that decoding is successful and decoding is stopped. On the other hand, when ĉ estimated for each iteration decoding up to the maximum number of iteration decoding does not pass the inspection through decoding of the external concatenated code, it is determined that decoding has failed.

In configuring each iteration decoding, hard decision and external concatenated code decoding may be performed after the first and second MAP decoding. In this case, one iteration decoding may include a series of processes (first MAP decoding—hard decision—decoding of external concatenated code—second MAP decoding—hard decision—decoding of external concatenated code). In this case, when the decoding after the first MAP decoding is successful, the decoding may be terminated immediately without performing the second MAP decoding.

In addition, the maximum number of iterations can be defined by subdividing the maximum number of half-iterations. For example, one time of the first MAP or second MAP decoding and the subsequent process accordingly are defined as half-iteration, and the maximum value for such a process may be defined in advance. Half-iteration may refer, for example, to performing one of the first and second MAP decoding and subsequent processes (hard decision and decoding of external concatenated codes). When the number of maximum half-iterations is designated as an odd number, the first MAP decoding and subsequent processes are completed, and the decoding is terminated.

A decoding of the hard decision and the external concatenated code may not be performed every full iteration or every half iteration. For example, it may be considered to reduce the number of operations and complexity by performing hard decision and decoding of external concatenated code every full iteration of a specific period (period is greater than 1), or every half iteration.

An operation in which the two MAP decoders alternately perform decoding in the turbo decoding process will now be briefly described. The first MAP decoder 710 receives $\Lambda(x)$, $\Lambda(z)$ as an intrinsic LLR sequence and $\Gamma_{2 \to 1}$ corresponding to the extrinsic LLR sequence from the second MAP decoder. In the first iteration decoding, all element LLRs of $\Gamma_{2 \to 1}$ are initialized to 0, and since the second iteration decoding, a meaningful extrinsic LLR generated by the second MAP decoder is input. The first MAP decoder generates extrinsic LLR $\Gamma_{1 \to 2}$ to be delivered to the second decoder based on these three LLR sequences $\Lambda(x)$, $\Lambda(z)$, $\Gamma_{2 \to 1}$. As interleaving 410 is performed between the inputs of the first RSC encoder 420 and the second RSC encoder 421 in the transmitter, the order of the extrinsic LLRs generated by the first MAP decoder is changed through the same interleaving process 720, and $\Gamma'_{1 \to 2}$ is generated and transmitted to the second MAP decoder.

The second MAP decoder 711 receives $\Lambda(x')$, $\Lambda(z')$ as an intrinsic LLR sequence, and receives the extrinsic LLR sequence $\Gamma'_{1 \to 2}$ from the first MAP decoder generated as described above. The second MAP decoder generates an extrinsic LLR $\Gamma'_{2 \to 1}$, which is to be transmitted to the second decoder, based on the three LLR sequences $\Lambda(x')$, $\Lambda(z')$, $\Gamma'_{1 \to 2}$. Likewise, the extrinsic LLR generated by the second MAP decoder is reordered through deinterleaving 730 which is an inverse process of the interleaving 720, and $\Gamma_{2 \to 1}$ is generated and transmitted to the first MAP decoder.

In the hard decision 740, a posteriori LLR (AP-LLR) is generated by first, combining $\Gamma_{1 \to 2}$ generated by the intrinsic LLR sequence AAA, the first MAP decoder, and $\Gamma_{2 \to 1}$ generated by the second MAP decoder. Herein, the generated AP-LLR is related to the encoding input bit sequence c, and the length is K. Based on the obtained AP-LLR, ĉ, which is an estimate for the encoding input bit sequence c, is generated. In this process, each LLR is compared with 0 based on Equation 2, and when the LLR value is greater than 0, the bit value is estimated as 0, and when the LLR value is less than 0, the bit value is estimated as 1. When the LLR value becomes 0 in a fixed-point implementation, the bit estimate is determined in a predetermined manner.

In the decoder (750) of the external concatenated code, the validity of the ĉ is determined by decoding the estimated encoding input bit sequence ĉ obtained by the hard decision 740 based on the concatenated code. In LTE and general turbo code systems, CRC codes are used as external concatenated codes. In the decoding of the CRC code, when the check sum is calculated based on the structure of ĉ and the given CRC code, and its value is 0, it is determined that ĉ has no error. Conversely, when the value is not 0, it is determined that ĉ has an error. When it is determined that there is no error, the turbo decoder terminates the decoding and outputs ĉ as the correct estimation. When it is determined that there is an error, the turbo decoder continues to perform MAP decoding. This process is performed up to a predetermined number of maximum iteration decoding or up to a number of maximum half-iteration decoding is performed.

In an embodiment, when the turbo decoding finally fails, post processing based on Table 1 or Table 2 may be performed. As described above, in certain code parameters (code dimension, code length, and code rate) where puncturing largely occur, one bit remains uncoded in c, and the bit is very vulnerable to errors because it is not protected by turbo code. As shown in FIG. 6, even when i−1 bits among the K bits that make up c are estimated normally by the turbo code, one bit that is not protected may cause the entire decoding to fail. In an embodiment, when the decoding is likely to fail due to the above problem, a method for performing CRC inspection again by inverting one corresponding unencoded bit (flip, converting bit value 0 to 1 and 1 to 0) is disclosed. As previously described in Table 1 or Table 2, since a condition in which a problem occurs and an index of a bit not encoded under the condition may be identified in advance by examining all combinations of code dimensions and code lengths in the LTE turbo code system, the operation of the present disclosure may be simply realized without any additional operation.

Figure 8:
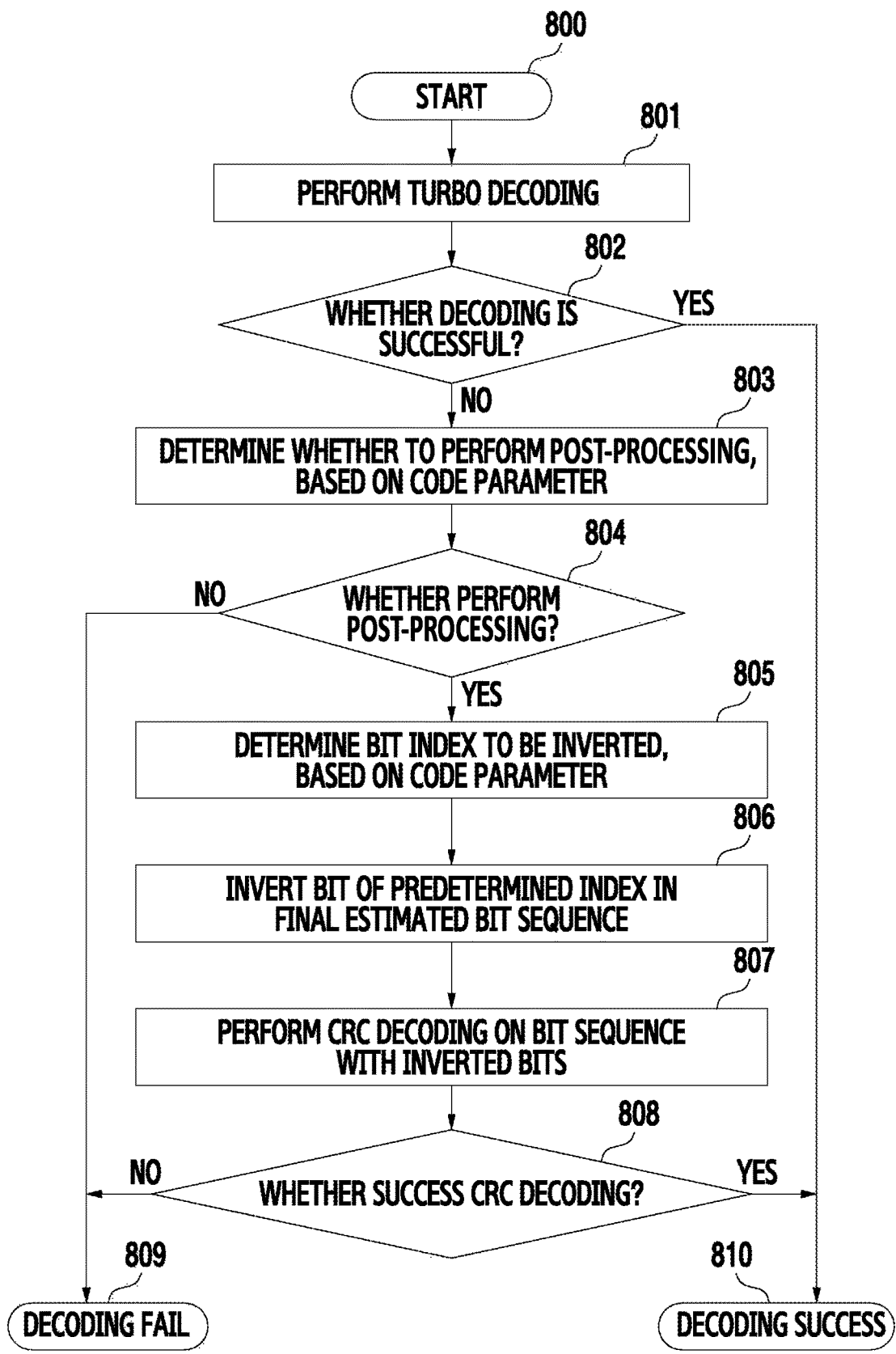
FIG. 8 is a flowchart illustrating an example operation of a turbo code decoder operated according to embodiments.

FIG. 8 is a flowchart illustrating example operations of a turbo code decoder operated according to various embodiments.

The decoder may perform the decoding operation of the turbo code described above with reference to FIG. 7 (801).

In the case of identifying whether decoding is successful or unsuccessful by decoding the external concatenated code (802), when the estimated ĉ is determined to be free of errors, immediately, it is determined that decoding is successful and terminated (810). On the other hand, when it is determined that decoding has failed, it is determined whether to perform post-processing, unlike the conventional decoding immediately terminated (803). Determination of whether to perform the post-processing is made based on the code parameter (code dimension, code length, code rate). According to an embodiment, whether to perform the post-processing may be determined based on any one of the following conditions or a combination of one or more conditions based on the previous analysis.

in case that the code dimension K is one of the seven values {48, 72, 80, 88, 120, 160, 208} in case that the code dimension K is one of the seven values {48, 72, 80, 88, 120, 160, 208} and the code rate R=K/N is greater than or equal to a predetermined threshold The threshold value for the code rate may be a common value determined regardless of the code dimension K.

The threshold value for the code rate may be a separate value determined according to the code dimension K.

in case that the code dimension K is one of the seven values {48, 72, 80, 88, 120, 160, 203} and the code length is less than or equal to a predetermined threshold The threshold value for the code length may be a common value determined regardless of the code dimension K.

The threshold value for the code length may be a separate value determined according to the code dimension K.

It should be noted that the condition for determining whether to perform post-processing is not limited to the above embodiment and may be determined in various forms. The decoder determines whether post-processing is performed through such condition inspection (804) and when the condition is not satisfied, immediately determines that the decoding has failed and terminates a series of processes (809). When the condition is satisfied, the bit index to invert the bit is determined according to the code dimension K as shown in Table 2 (805). As described above, it should be noted that the bit index of Table 2 is described as zero-based numbering. Based on the bit index to invert the bit being determined, a modified estimated bit sequence ĉ'ĉ is obtained (806) by inverting the bits of the corresponding index (converting bit 0 to 1 and bit 1 to 0) from the ĉ finally obtained in turbo decoding (801). And the modified estimated bit sequence ĉ' is decoded by an external concatenated code (e.g. decoding of CRC code) again (807). When it is determined that there is no error in the ĉ ' through this additional decoding (808), the ĉ' is output as the final result and the decoding success is reported (810). When it is determined that there is an error in the ĉ, it is finally reported that decoding has failed (809). An estimated bit sequence to be output when decoding fails may be determined by a predetermined rule.

According to an embodiment, the decoder determines the position of the bit to be inverted deterministically for a given code dimension without performing any arithmetic operation to find the bit index to be inverted.

In addition, in an embodiment, an operation for finding the index to be inverted may be performed completely separated from the turbo decoder. In an embodiment, since any information and results generated by the turbo decoder are not utilized, the operation may be performed completely separately.

In addition, an embodiment generates a single modified estimated bit sequence. Since a plurality of assumptions are not considered, it is unlikely that any incorrect bit sequence may pass through a CRC inspection or the like, and thus the present disclosure has an advantage in terms of final error-detection capability.

Figure 9:
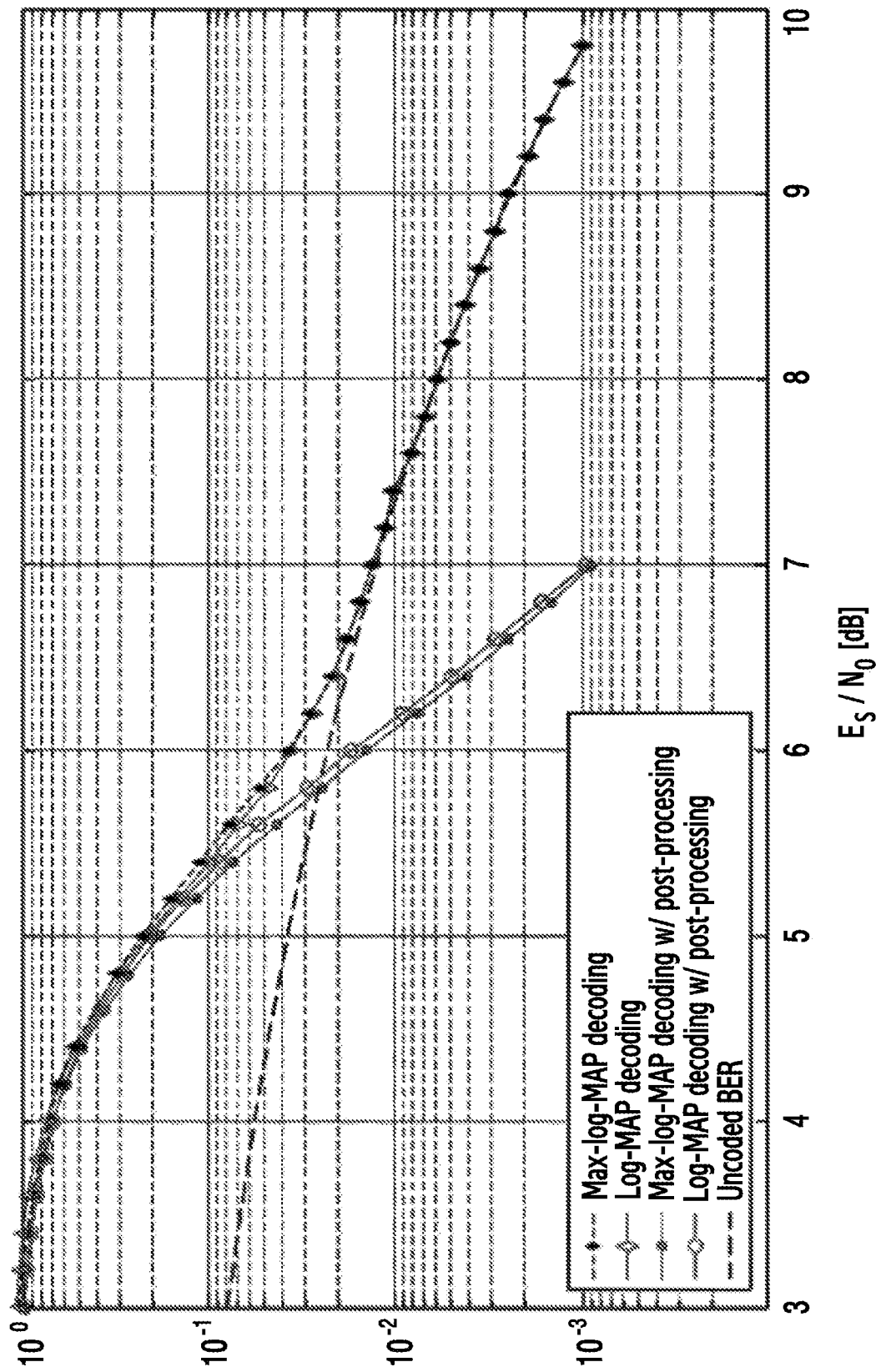
FIG. 9 is a graph illustrating a performance gain obtained according to embodiments.

FIG. 9 is a graph illustrating performance improvement according to an embodiment applied, in the situation of FIG. 6. The experimental environment is the same as that described with respect to FIG. 6, and only improved performance according to various embodiments is additionally shown. To achieve the same block error rate (BLER), the SNR ($E_s/N_0$) is required about 3 dB less.

According to an embodiment, a method for performing turbo decoding includes: receiving a transmitted signal; generating input of turbo decoding such as LLR from the transmitted signal; performing decoding of a turbo code based on the input of the LLR or the like; determining whether decoding succeeds or fails based on a CRC code concatenated or the like in the middle step of decoding or the last step of decoding; determining whether to perform post-processing according to a code parameter (a code dimension, a length, or a parameter related thereto) based on determining that decoding has failed based on the concatenated CRC code or the like; and performing post-processing according to the code parameter based on determining to perform post-processing. The post-processing performed according to the code parameter is a process of performing an inspection with a CRC code or the like again by flipping at least one or more bits, in the bit sequence that performed the inspection through concatenated CRC code obtained from the decoding of the turbo code, and the position of the bit to be flipped is determined based on the code parameter.

According to an embodiment, a device for performing turbo decoding includes: a device for receiving the transmitted signal; a device for generating an input of turbo decoding such as an LLR, from the transmitted signal; a device for decoding a turbo code based on the input such as the LLR; a device determining whether decoding succeeds or fails based on a CRC code concatenated or the like in the middle step of decoding or the last step of decoding; a device determining whether to perform post-processing according to a code parameter (a code dimension, a length, or a parameter related thereto) based on determining that decoding has failed based on the concatenated CRC code or the like; and a device for operating a post-processor according to a code parameter based on determining to perform post-processing. The post-processor performed according to the code parameter is a device for performing an inspection with a CRC code or the like again by flipping at least one or more bits, in the bit sequence that performed the inspection through concatenated CRC code obtained from the decoding of the turbo code, and the position of the bit to be flipped is determined based on the code parameter. Although it has been described above that the turbo decoding device is configured to include a plurality of devices, it should be noted that the device for performing each operation may be implemented as an individual device or may be implemented as one device to perform all of the operations.

The methods of the present disclosure may be implemented in the form of hardware, software, or a combination of hardware and software.

When implemented in software, a computer-readable storage medium or computer program product storing one or more programs (software modules) may be provided. One or more programs stored in a computer-readable storage medium, or computer program product are configured for execution by one or more processors in an electronic device. One or more programs include instructions for causing an electronic device to execute methods according to embodiments.

Such a program (software module, software) may be stored in a non-volatile memory including random access memory and flash memory, Read Only Memory (ROM), Electrically Erasable Programmable Read Only Memory (EEPROM), magnetic disc storage device, Compact Disc-ROM (CD-ROM), Digital Versatile Discs (DVDs), other forms of optical storage, or magnetic cassette. Alternatively, it may be stored in a memory configured with a combination of some or all of them. In addition, a plurality of each configuration memory may be included.

In addition, the programs may be stored on communication networks such as the Internet, Intranet, local area network (LAN), wide area network (WLAN), or storage area network (SAN), and attachable storage devices that may be accessed through a communication network including a combination thereof. The storage device may access a device performing an embodiment of the present disclosure through an external port. In addition, a separate storage device on the communication network may access a device performing an embodiment of the present disclosure.

In various embodiments of the present disclosure described above, elements included in the present disclosure are expressed in the singular or plural according to the specific embodiments presented. However, the singular or plural expression is appropriately selected for the context presented for convenience of description, and the present disclosure is not limited to the singular or plural element, and even when a element is expressed in plural, it may include a singular, or even when a component is expressed in a singular, it may be include a plurality.

While the disclosure has been illustrated and described with reference to various example embodiments, it will be understood that the various example embodiments are intended to be illustrative, not limiting. It will also be understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. A method performed by a first device of a communication system comprising:
   obtaining an estimated bit sequence based on signals received from a second device;
   based on a decoding of the estimated bit sequence being unsuccessful, determining whether a specified condition for a code dimension is satisfied or not, the code dimension indicating a length of the estimated bit sequence;
   based on the specified condition being satisfied, obtaining a modified bit sequence by inverting one bit in the estimated bit sequence, wherein a position of the one bit in the estimated bit sequence to be inverted is determined by the code dimension; and
   performing a cyclic redundancy check (CRC) for the modified bit sequence.

2. The method of claim 1,
   wherein, in a case that the one bit in the estimated bit sequence is 1, the one bit is converted to 0, and
   wherein, in a case that the one bit in the estimated bit sequence is 0, the one bit is converted to 1.

3. The method of claim 1, wherein the specified condition indicates that the code dimension is one of specified values.

4. The method of claim 1, wherein the specified condition indicates that the code dimension is one of specified values and a code rate is greater than a specified threshold.

5. The method of claim 4,
   wherein the specified values include at least one of 48, 72, 80, 88, 120, 160, 208, or a combination thereof, and
   wherein the specified threshold is substantially 0.75.

6. The method of claim 1, wherein the specified condition indicates that the code dimension is one of specified values and a code length is smaller than a specified threshold.

7. The method of claim 6,
   wherein the estimated bit sequence is obtained based on a turbo coding system using the code dimension and a code length, and
   wherein the code length indicates a length of codeword bit sequence of the signals.

8. The method of claim 6, wherein the specified values include at least one of 48, 72, 80, 88, 120, 160, 208, or a combination thereof.

9. The method of claim 1,
   wherein the position of the one bit is indicated by one bit index,
   wherein the one bit index is 40 based on the code dimension being 48,
   wherein the one bit index is 57 based on the code dimension being 72,
   wherein the one bit index is 72 based on the code dimension being 80,
   wherein the one bit index is 66 based on the code dimension being 88,
   wherein the one bit index is 105 based on the code dimension being 120,
   wherein the one bit index is 152 based on the code dimension being 160, and
   wherein the one bit index is 200 based on the code dimension being 208.

10. A first device of a communication system comprising:
    at least one processor; and
    memory storing instructions that, when executed by the at least one processor, cause the first device to:
    obtain an estimated bit sequence based on signals received from a second device,
    based on a decoding of the estimated bit sequence being unsuccessful, determine whether a specified condition for a code dimension is satisfied or not, the code dimension indicating a length of the estimated bit sequence,
    based on the specified condition being satisfied, obtain a modified bit sequence by inverting one bit in the estimated bit sequence, wherein a position of the one bit in the estimated bit sequence to be inverted is determined by the code dimension, and
    perform a cyclic redundancy check (CRC) for the modified bit sequence.

11. The first device according to claim 10,
    wherein, in a case that the one bit in the estimated bit sequence is 1, the one bit is converted to 0, and
    wherein, in a case that the one bit in the estimated bit sequence is 0, the one bit is converted to 1.

12. The first device according to claim 10, wherein the specified condition indicates that the code dimension is one of the preset values.

13. The first device according to claim 10, wherein the specified condition indicates that the code dimension is one of preset values and a code rate is greater than a specified threshold.

14. The first device according to claim 13,
wherein the preset values include at least one of 48, 72, 80, 88, 120, 160, 208, or a combination thereof, and
wherein the specified threshold is substantially 0.75.

15. The first device according to claim 10, wherein the specified condition indicates that the code dimension is one of preset values and a code length is smaller than a specified threshold.

16. The first device according to claim 15,
wherein the estimated bit sequence is obtained based on a turbo coding system using the code dimension and a code length, and
wherein the code length indicates a length of codeword bit sequence of the signals.

17. The first device according to claim 15, wherein the preset values include at least one of 48, 72, 80, 88, 120, 160, 208, or a combination thereof.

18. The first device according to claim 10,
wherein the position of the one bit is indicated by one bit index,
wherein the one bit index is 40 based on the code dimension being 48,
wherein the one bit index is 57 based on the code dimension being 72,
wherein the one bit index is 72 based on the code dimension being 80,
wherein the one bit index is 66 based on the code dimension being 88,
wherein the one bit index is 105 based on the code dimension being 120,
wherein the one bit index is 152 based on the code dimension being 160, and
wherein the one bit index is 200 based on the code dimension being 208.

19. A non-transitory computer-readable storage medium comprising memory storing instructions that, when executed by a processor, cause a first electronic device to perform operations including:
obtaining an estimated bit sequence based on signals received from a second device,
based on a decoding of the estimated bit sequence being unsuccessful, determining whether a specified condition for a code dimension is satisfied or not, the code dimension indicating a length of the estimated bit sequence,
based on the specified condition being satisfied, obtaining a modified bit sequence by inverting one bit in the estimated bit sequence, and
performing a cyclic redundancy check (CRC) for the modified bit sequence,
wherein a position of the one bit in the estimated bit sequence to be inverted is determined by the code dimension.

* * * * *